(12) United States Patent
Cho et al.

(10) Patent No.: US 6,716,699 B2
(45) Date of Patent: Apr. 6, 2004

(54) METHOD FOR MANUFACTURING FLASH MEMORY DEVICE

(75) Inventors: Min-soo Cho, Seongnam (KR); Sang-wook Park, Seoul (KR); Dai-geun Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/353,374

(22) Filed: Jan. 29, 2003

(65) Prior Publication Data
US 2003/0155608 A1 Aug. 21, 2003

(30) Foreign Application Priority Data
Feb. 21, 2002 (KR) .......................................... 2002-9323

(51) Int. Cl.⁷ ............................................ H01L 21/336
(52) U.S. Cl. ...................................... 438/257; 438/265
(58) Field of Search ............................... 438/257–267; 257/314–320, E29.304, E29.129, E29.3, E21.179, E21.422, E21.68, E21.687, E21.688

(56) References Cited
U.S. PATENT DOCUMENTS

2002/0034849 A1 * 3/2002 Wang et al. ................. 438/257
2003/0053347 A1 * 3/2003 Wang ........................... 365/200
2003/0113969 A1 * 6/2003 Cho et al. ..................... 438/257
2003/0139010 A1 * 7/2003 Wang ........................... 438/257

* cited by examiner

Primary Examiner—W. David Coleman
Assistant Examiner—Brook Kebede
(74) Attorney, Agent, or Firm—Mills & Onello, LLP

(57) ABSTRACT

In a method for manufacturing a flash memory device, a first gate insulating film, a first gate conductive film, and a second insulating film are sequentially formed on a semiconductor substrate. A region where a first gate is to be formed is defined by etching the second insulating film to expose an upper portion of the first gate conductive film. Second conductive film spacers are formed along sidewalls of the etched second insulating film. An oxide film is formed on the exposed surface of the second conductive film spacers and the first gate conductive film. Silicon insulating spacers are formed on the sidewalls of the etched second insulating film. A source junction contact hole is formed by etching the first gate conductive film and the first gate insulating film by using the second insulating film and the silicon insulating film spacers as a mask. A source junction contact fill is formed filling the source junction contact hole. The first gate is formed by sequentially removing the second insulating film and the first gate conductive film.

16 Claims, 8 Drawing Sheets

METHOD FOR MANUFACTURING FLASH MEMORY DEVICE

RELATED APPLICATIONS

This application claims the benefit of the priority date of Korean Patent Application No. 2002-09323, filed Feb. 21, 2002 in the Korean Intellectual Property Office, the disclosure of which is incorporated herein in its entirety by reference.

BACKGROUND OF THE INVENTION

1. Field of the Invention

The present invention relates to a method for manufacturing a semiconductor memory device, and more particularly, to a method for manufacturing a flash memory.

2. Description of the Related Art

Flash memory devices are commonly constructed with double gates including a floating gate and a control gate. In this manner, data is memorized (i.e. stored) or removed (I.e. read) when a voltage is applied to the double gates. In particular, cooperation between the floating gate and the control gate greatly affects the speed and reliability of a memory, and thus techniques for manufacture of the floating gate and the control gate are under constant development.

FIG. 13 is a cross sectional view of a conventional flash memory device having a control gate and the floating gate.

Referring to FIG. 13, the conventional flash memory device includes a plurality of control gates 1230, a source junction 1201, a drain junction 1101, a junction contact fill 1210 and at least two floating gates 1120. The plurality of control gates 1230 are aligned linearly. The source junction 1201 is interposed between the control gates 1230 and is formed on a semiconductor substrate 1100. The drain junction 1101 is disposed at both sides of the control gates 1230 and is formed on the semiconductor substrate 1100. The junction contact fill 1210, at both sides of which the control gates 1230 are formed and inner insulating film spacers 1190 are interposed between the control gates 1230, connects a source junction 1201 to interconnections of an upper portion of the contact.

The floating gate 1120 is interposed between a sidewall of the control gate 1230 and a second gate insulating film 1220, and is also interposed between a sidewall of the control gate 1230 and a first gate insulating film 1110 under the second gate insulating film 1220, and partially overlaps with the source junction 1201 of the semiconductor substrate 1100. Outer insulating film spacers 1260 are formed on outer sidewalls of the control gate 1230. Here, inner insulating film spacers 1190 are formed on the inner sidewalls of the control gate 1230, burying the floating gate 1120. A predetermined contact hole (not shown) is formed between inner insulating film spacers 1190 which face each other. The junction contact fill 1210 is formed of a conductive film to cover the predetermined contact and thus connects interconnections (not shown) of the upper portion and the source junction 1201. Here, the control gate 1230 and the floating gate 1120 are formed of doped polysilicon.

In the conventional flash memory device, the second gate insulating film 1220 is formed on the floating gate 1120, and thus it functions as a switch between the floating gate 1120 and the control gate 1230. If a potential difference occurs, charges move, and thus information may be memorized or removed.

However, in the conventional flash memory, the second gate insulating film 1220 is formed by oxidizing polysilicon and has an uneven surface, a fact which makes it difficult to uniformly form the second gate insulating film 1220 or floating gate 1120. Thus, on/off operations between the floating gate 1120 and the control gate 1230 are not executed stably. In particular, the second gate insulating film 1220 in the region in contact both the control gate 1230 and the floating gate 1120 is thick and not uniform, and thus an error can occur when erasing data from the memory device.

SUMMARY OF THE INVENTION

It is an object of the present invention to provide a semiconductor memory device that can facilitate an erase operation by forming a sharp region between a first gate, i.e., a floating gate, and a second gate, i.e., a control gate, of a flash memory device and making smooth movement of charges possible during an erase operation.

According to a first embodiment of the present invention, there is provided a method for manufacturing a flash memory device comprising (a) sequentially forming a first gate insulating film, a first gate conductive film, and a second insulating film on a semiconductor substrate, (b) defining a region for a first gate by etching part of the second insulating film to expose an upper portion of the first gate conductive film, (c) forming second conductive film spacers along sidewalls of the patterned second insulating film, (d) forming an oxide film on the exposed surface of the second conductive film spacers and the first gate conductive film, (e) forming silicon insulating spacers on sidewalls of the etched second insulating film, (f) forming a source junction contact hole by etching the first gate conductive film and the first gate insulating film, using the second insulating film and the silicon insulating film spacers as an etch mask, (g) forming a source junction contact fill by filling the source junction contact hole with conductive film, (h) forming the first gate by sequentially removing the second insulating film and the first gate conductive film beneath the second insulating film, (i) forming a second gate insulating film on an exposed sidewall of the first gate, (j) exposing upper portions of the source junction contact fill and the second gate conductive film by sequentially forming a second gate conductive film and a silicon nitride film on the semiconductor substrate and removing the silicon nitride film so that it is level with an upper portion of the insulating spacers, (k) forming a mask silicon oxide layer over the exposed source junction contact fill and the second gate conductive film and (l) forming a second gate by sequentially removing the exposed silicon nitride film and the second gate conductive film under the silicon nitride film.

Here, the first gate conductive film is formed of conductive polysilicon, and the second insulating film is formed of silicon nitride.

In step (c), a conductive polysilicon is formed on the semiconductor substrate. Then, the conductive polysilicon is etched in an anisotropic dry etching process, and thus the polysilicon spacer is formed in the lower portion of the sidewall of the mask insulating film. The silicon oxide film of step (d) is formed by oxidizing the exposed first gate conductive film and the second conductive film spacers.

In step (e), a silicon insulating film is formed on the entire semiconductor substrate and the silicon insulating film is anisotropically etched by dry etching. Then, the silicon insulating spacers is formed in the sidewall of the etched silicon nitride film.

After that, the polysilicon of the first gate conductive film and the first gate insulating film are removed by dry etching, and a source junction contact hole is formed. Preferably, the silicon oxide film is formed by chemical vapor deposition CVD.

In order to form the source junction contact fill, a doped polysilicon is deposited as a filling conductive film by low pressure chemical vapor deposition LPCVD on the entire semiconductor substrate. Then, the filling conductive film formed of the polysilicon is removed by chemical mechanical polishing, and thus the source junction contact fill is formed between grooves of the gate pattern.

The sidewall of the first gate conductive film is exposed by removing the second insulating film formed of the silicon nitride by wet etching using a phosphoric acid ($H_3PO_4$) solution. A second gate insulating film is formed on the exposed sidewall of the first gate insulating film. Here, the second gate insulating film may be formed by two methods. Firstly, it may be formed by oxidizing the sidewall of the first gate conductive film of the polysilicon by dry oxidation or wet oxidation. Secondly, it may be formed like a spacer by forming a silicon oxide film to an appropriate thickness by CVD and a spacer etching of the silicon oxide film by anisotropic etching.

A polysilicon as the second gate conductive film and a silicon insulating film are sequentially formed on the entire semiconductor substrate. The silicon insulating film and the second gate conductive film are sequentially removed by chemical mechanical polishing to expose the source junction contact fill. Here, the silicon insulating film is a silicon nitride film.

A mask silicon oxide film is formed by oxidizing the source junction contact fill and the exposed portion of the second gate conductive film by dry oxidation or wet oxidation. The silicon insulating film and the second gate conductive film are removed by dry etching using the silicon oxide film as a mask, and thus a second gate pattern is formed on the second gate conductive film.

It is preferable that the second gate conductive film is formed of a combination of doped polysilicon and undoped polysilicon on the doped polysilicon, so as to make the oxide film thin when the oxide film is formed by oxidizing the exposed polysilicon.

As described above, according to the present invention, the sharp region where the first conductive film contacts the second gate conductive film is formed by oxidizing the first gate conductive film formed of the floating gate, and thus charges are concentrated in the sharp region, such that electronic data can be readily stored or erased.

BRIEF DESCRIPTION OF THE DRAWINGS

The above objects and advantages of the present invention will become more apparent by describing in detailed a preferred embodiment thereof with reference to the attached drawings in which.

DETAILED DESCRIPTION OF PREFERRED EMBODIMENTS

The present invention now will be described more fully with reference to the accompanying drawings, in which a preferred embodiment of the invention is shown.

Figure 1A:
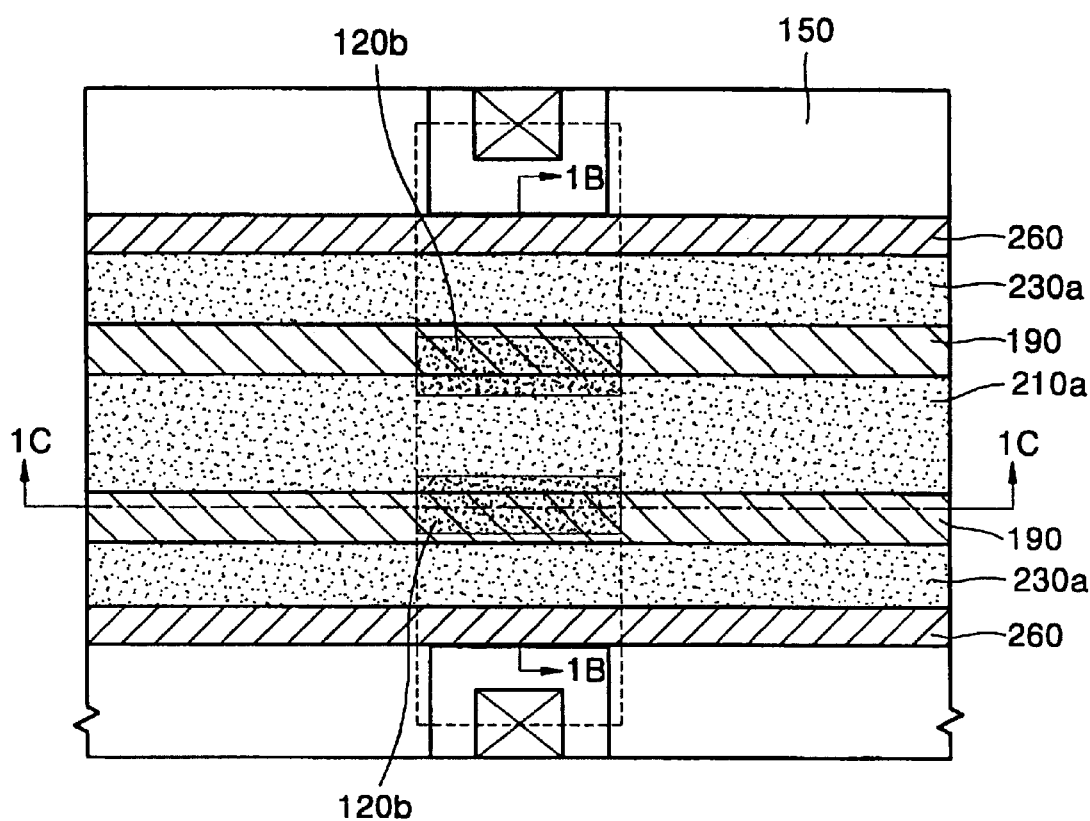
FIG. 1A is a plan view of a flat array of a flash memory device manufactured according to the present invention.
Figure 1B:
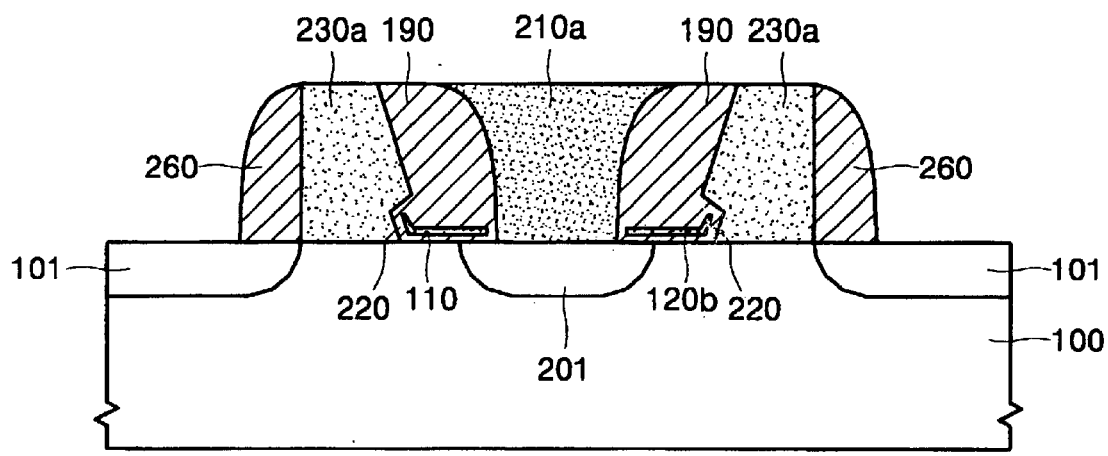
FIG. 1B is a sectional view of a cell of the flash memory device cut along line 1B—1B of FIG. 1A.

FIG. 1A is a plan view of a flat array of a flash memory device manufactured according to the present invention. FIG. 1B is a sectional view of a cell of the flash memory device cut along line 1B—1B of FIG. 1A, and FIG. 1C is a sectional view of a cell of the flash memory device cut along line 1C—1C of FIG. 1A.

Referring to FIGS. 1A and 1B, a flash memory device according to the present invention includes a plurality of source junctions 201 and drain junctions 101, a second gate 230a, i.e., a control gate, which is interposed between the source junctions 201 and drain junctions 101, silicon oxide film spacers 190 which are formed on the sidewalls of the second gates 230a which face each other and define a predetermined contact hole above the center of the source junction 201, first gates 120b in which a first gate insulating film 110 is placed in the region of contact between the silicon oxide film spacers 190 and the semiconductor substrate 100 and in which a second gate insulating film 220 is placed in the region of contact between the silicon oxide film spacers 190 and the second gates 230a, and a junction contact fill 210a which fills the contact hole between the silicon oxide film spacers 190 with a conductive film. The source junction 201 is interposed between the first gates 120b that are formed inwardly from the second gates 230a, and the drain junction 101 is formed in the semiconductor substrate 100, outwardly adjacent to the second gates 230a.

The dotted line of FIG. 1A represents an active region where the device is formed (hereinafter, it is referred to as AR). The region beyond the dotted line represents a region where the device is isolated (hereinafter, it is referred to as IR).

Figure 1C:
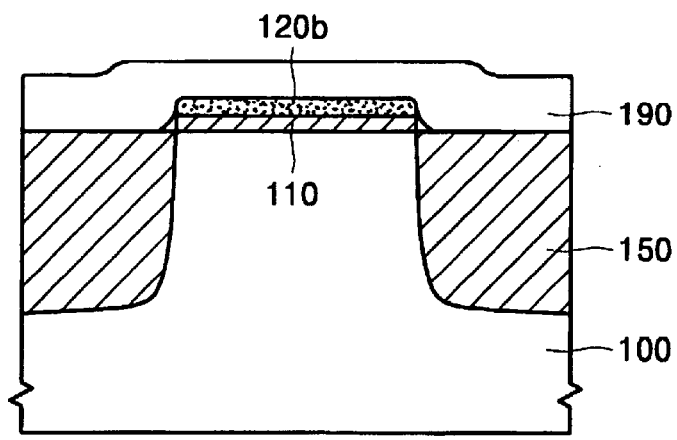
FIG. 1C is a sectional view of a cell of the flash memory device cut along line 1C—1C of FIG. 1A.

FIG. 1C is a vertical section of FIG. 1B.

FIG. 1C shows an insulating film for isolating a device 150 which are not shown in FIG. 1A and a cross section of the first gate 120b. In this view, the first gate 120b is rectangular and is adjacent to the inner sidewalls of the second gate 230a.

FIGS. 2 through 12 are sectional views for illustrating a method for manufacturing the flash memory device according to the present invention. Figures that illustrate relatively straightforward processes show both the word line direction and the bit line direction. In figures illustrating rather complicated processes, the word line direction is omitted for convenience.

Figure 2:
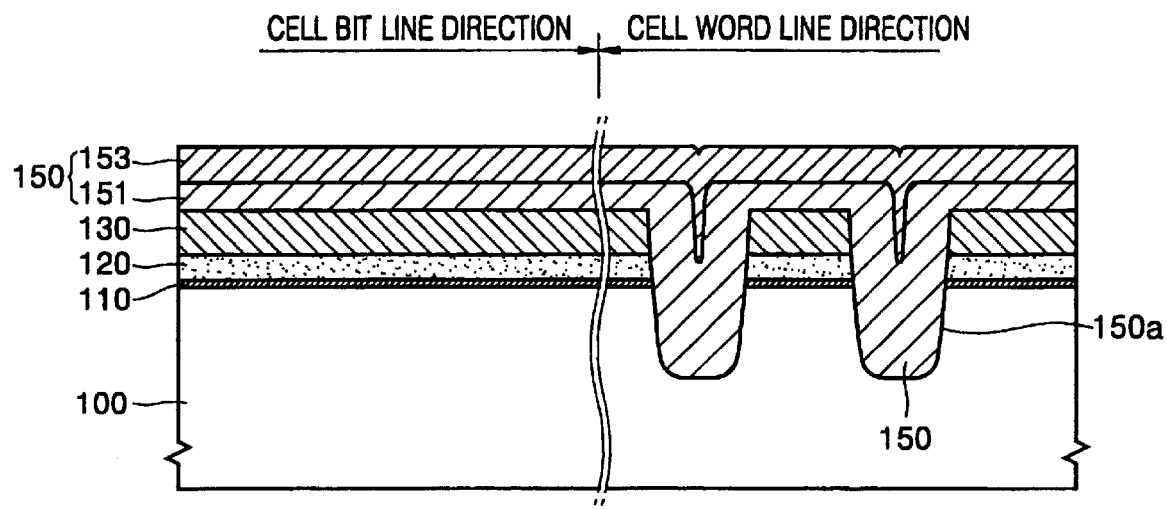
FIGS. 2 through 12 are sectional views illustrating a method for manufacturing the flash memory device according to the present invention.

Referring to FIG. 2, in order to isolate the device, a first gate insulating film 110, a gate conductive film 120, and a mask insulating film 130 are sequentially formed on a surface of the semiconductor substrate 100. Here, the first gate insulating film 110 is a silicon oxide film which is formed by thermally oxidizing the semiconductor substrate 100. The first gate conductive film 120 is a polysilicon film in which impurities are doped. The mask insulating film 130 is a silicon nitride film formed by chemical vapor deposition (CVD). A trench pattern(not shown) for isolating a device is formed on the mask insulating film 130 by a photolithography process. Then, a trench 150a is formed on the semiconductor substrate 100 by dry etching using the trench pattern as a mask, to a predetermined depth. After that, a filling silicon insulating film 150 is formed of silicon oxide thickly inside the trench 150a by CVD. Here, it is desirable that the filling silicon insulating film 150 be formed, for example, by plasma enhanced chemical vapor deposition (PE CVD) which has high deposition rate and has superior filling capability. The silicon insulating film 150 may be formed of a composition of silicon oxide film 153 by high density plasma chemical vapor deposition (HDP CVD).

Thus, the filling silicon insulating film 150 can be formed as a multilayered film by combining a first filling insulating film 151 formed by CVD and a second filling insulating film 153 formed by HDP CVD on the first filling insulating film 151.

Figure 3:
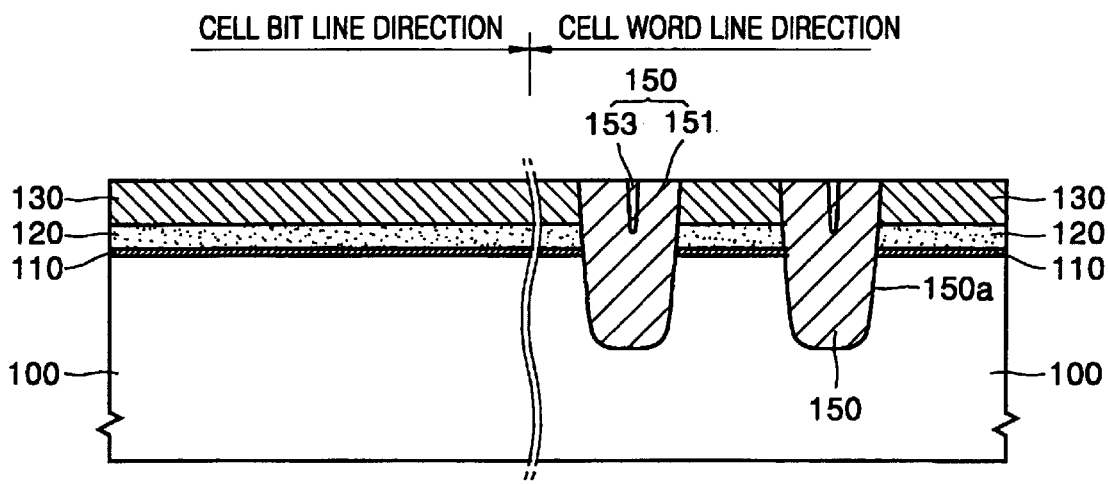
Figure 4:
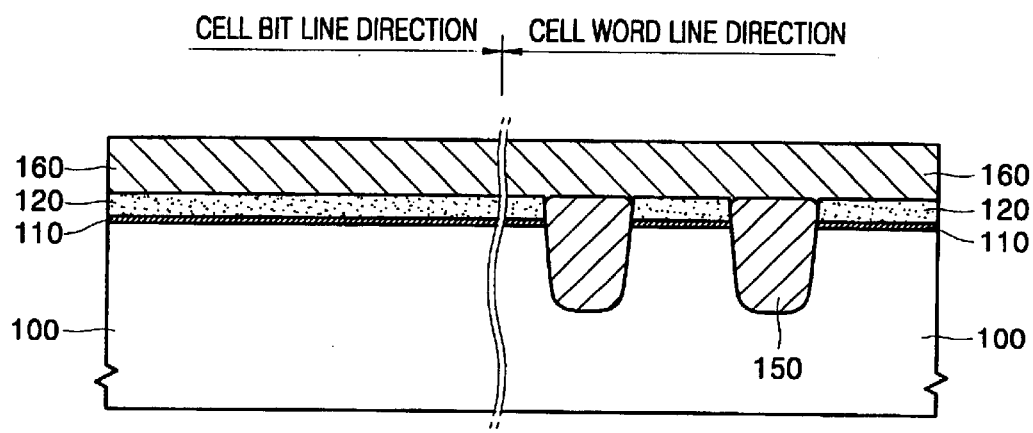

Referring to FIGS. 3 and 4, the filling silicon insulating film 150 is removed by chemical mechanical polishing until the mask insulating film 130 is exposed. The filling insulating film 150 only remains in the trench 150a, and thus the AR is formed. The mask insulating film 130 remaining on the semiconductor substrate 100 is removed by wet etching using a phosphoric acid ($H_3PO_4$) solution, and then a silicon nitride film 160 is formed on the resultant by low pressure chemical vapor deposition.

Figure 5:
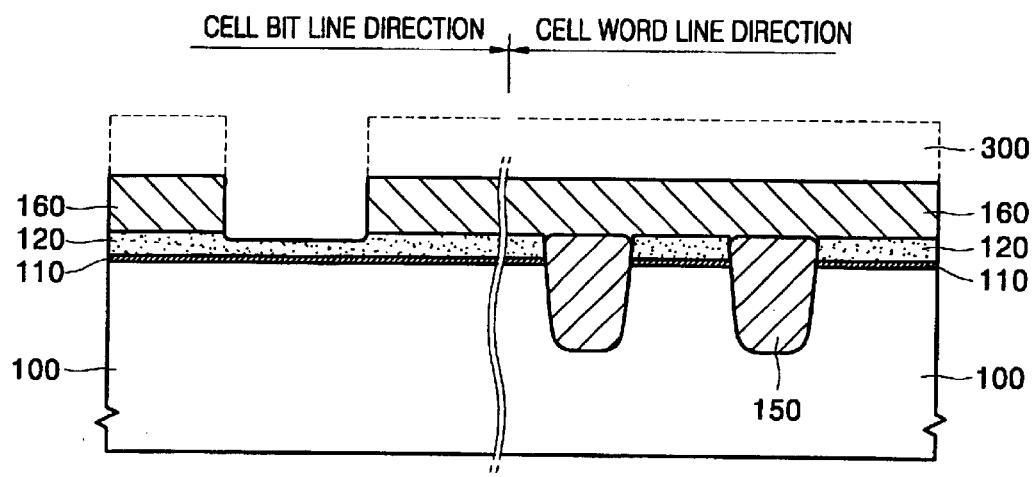

Referring to FIG. 5, the silicon nitride film 160 is coated with a photoresist(not shown) and a photoresist pattern 300, which shapes a region where a first gate can be formed, is formed through a photolithography process and subsequent processes. The photoresist pattern 300 is transferred to the silicon nitride film 160 by dry etching using the photoresist pattern 300 as a mask. During patterning, the upper portion of the first gate conductive film 120 is exposed such that the silicon nitride film 160 will have a region where the first gate can be formed in subsequent processes.

Figure 6:
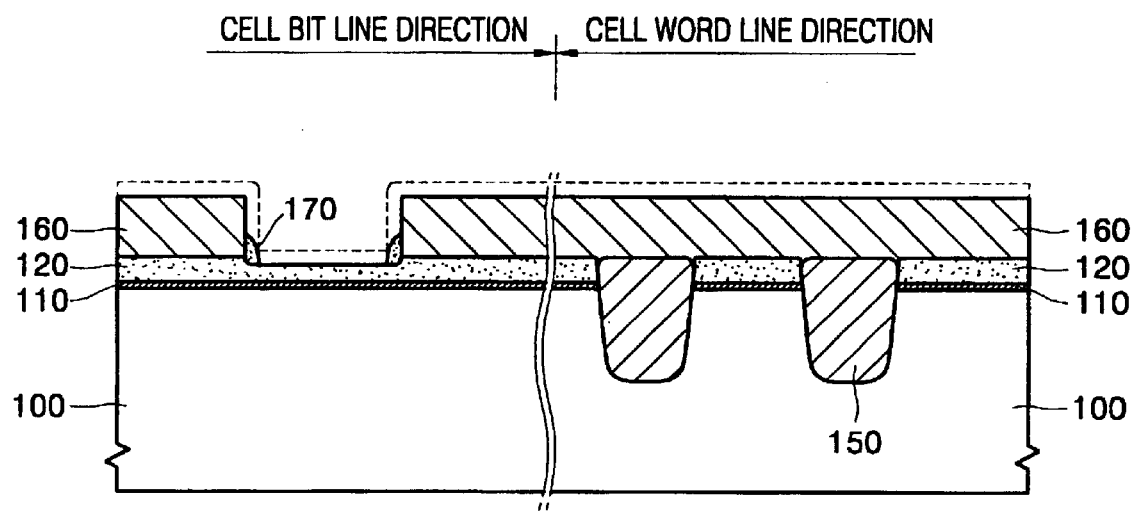
Figure 7:
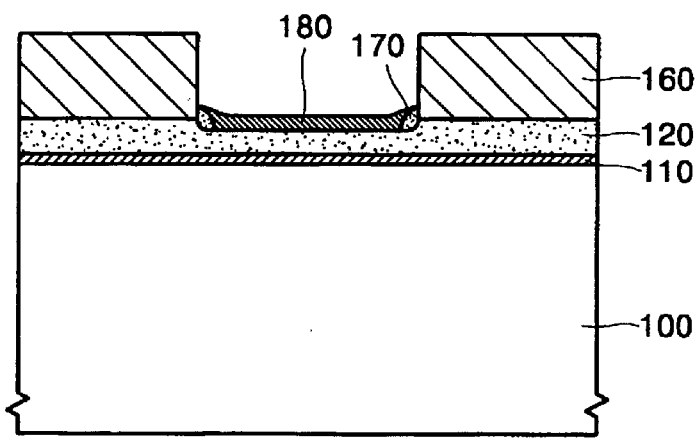

Referring to FIGS. 6 and 7, polysilicon is deposited to an appropriate thickness on the entire surface of the patterned silicon nitride film 160. Then, the polysilicon is removed by dry etching, and polysilicon spacers 170 are formed on the lower portions of the sidewalls of the region in the silicon nitride film 160 where the first gate will be formed. Here, the upper portion of the first gate conductive film 120 is exposed. Then, a thin silicon oxide film 180 is formed on the exposed upper portion of the first gate conductive film 120 and the surface of the polysilicon spacers 170 by using a thermal oxidation. Here, the silicon oxide film 180, which is formed by oxidizing the polysilicon of the polysilicon spacers 170 helps the first gate conductive film 120 to be formed more sharply, thereby improving the operation of erasing electrical data.

Figure 8:
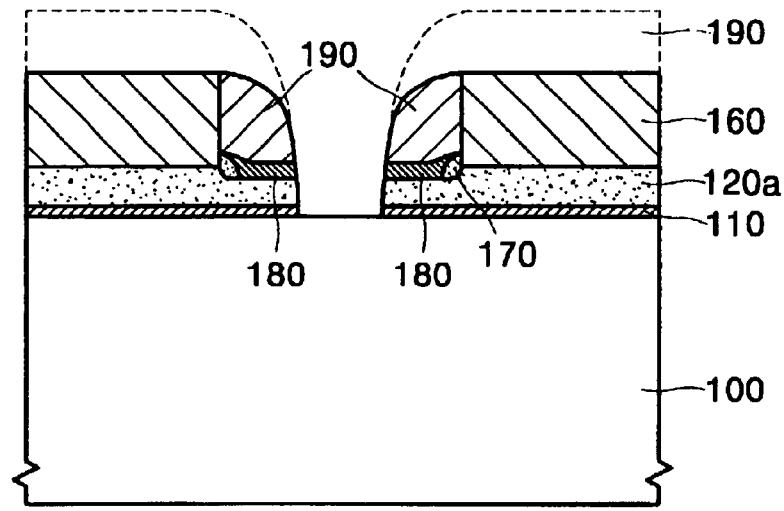

Referring to FIG. 8, a silicon oxide film of a predetermined thickness is formed on the entire surface of the semiconductor substrate 100 by using low pressure chemical vapor deposition or plasma enhanced chemical vapor deposition. Then, the silicon oxide film is etched by using anisotropic dry etching, and thus silicon oxide film spacers 190 which cover the first gate conductive film 120 and the silicon oxide film 180 is formed on the sidewalls of the patterned silicon nitride film 160. The silicon oxide film 180, the first gate conductive film 120, and the first gate insulating film 110 are sequentially etched using the silicon oxide film spacers 190 as a mask. Then, the surface of the semiconductor substrate 100 between the silicon oxide film spacers 190 is exposed, and thus a first gate pattern 120a is formed from the etched first gate conductive film 120. The source junction 201 (see FIG. 9) is formed in subsequent processes including an implanting process.

Figure 9:
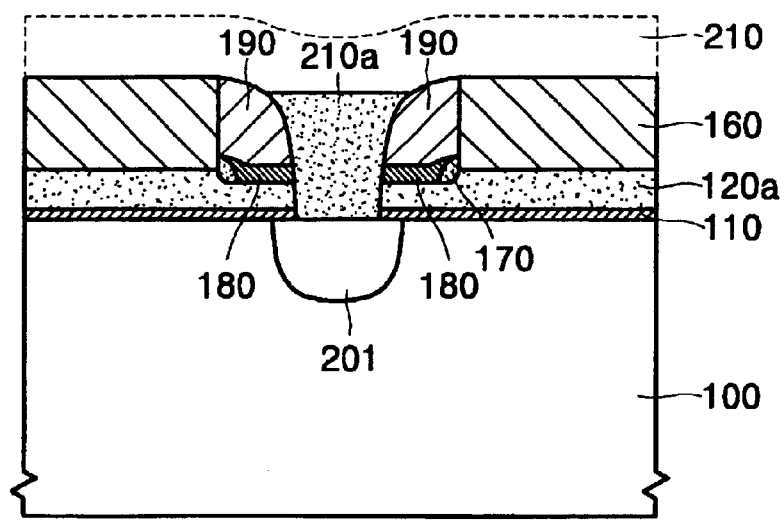

Referring to FIG. 9, a filling conductive film 210 consisting of conductive polysilicon is deposited thickly over the entire semiconductor substrate 100, thus filling a groove for contact between the silicon oxide film spacers 190. Then, the filling conductive film 210 is planarized by chemical mechanical polishing until the filling conductive film 210 is level with the upper portion of the silicon nitride film 160. Thus, a source junction contact fill 210a composed of the filling conductive film 210 fills the groove between the silicon oxide film spacers 190.

Figure 10:
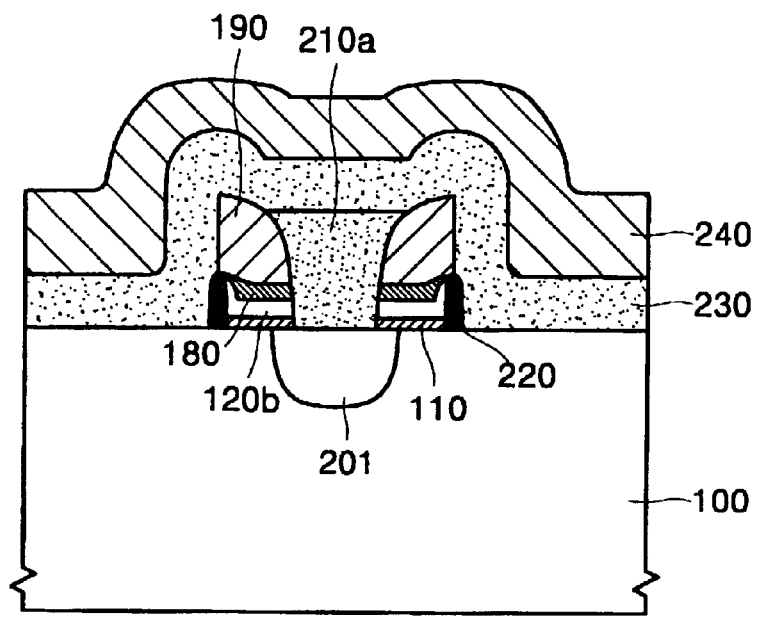

Referring to FIG. 10, the silicon nitride film 160 is removed by wet etching using a phosphoric acid ($H_3PO_4$) solution. Then, the first gate pattern 120a (see FIG. 9) and the first gate insulating film 110 are sequentially removed by dry etching using the silicon oxide film spacers 190 as a mask, and thus a first gate 120b is completely formed. A sidewall oxide film 220 is formed on the sidewalls of the first gate 120b. Here, the sidewall oxide film 220 may be formed of silicon oxide by directly oxidizing the sidewalls of the first gate 120b. In addition, the sidewall oxide film 220 may be formed in the manner spacers are formed by forming a silicon oxide film of an appropriate thickness using CVD and etching the silicon oxide film using dry etching. The silicon oxide film 220 on the sidewalls of the first gate insulating film 110 also functions as a second gate insulating film 220 for the second gate 230a of FIG. 12, which will be formed in a subsequent process. A second gate conductive film 230 is formed of conductive polysilicon over the entire semiconductor substrate 100 and a silicon nitride film 240 is formed on the resultant structure using CVD.

Figure 11:
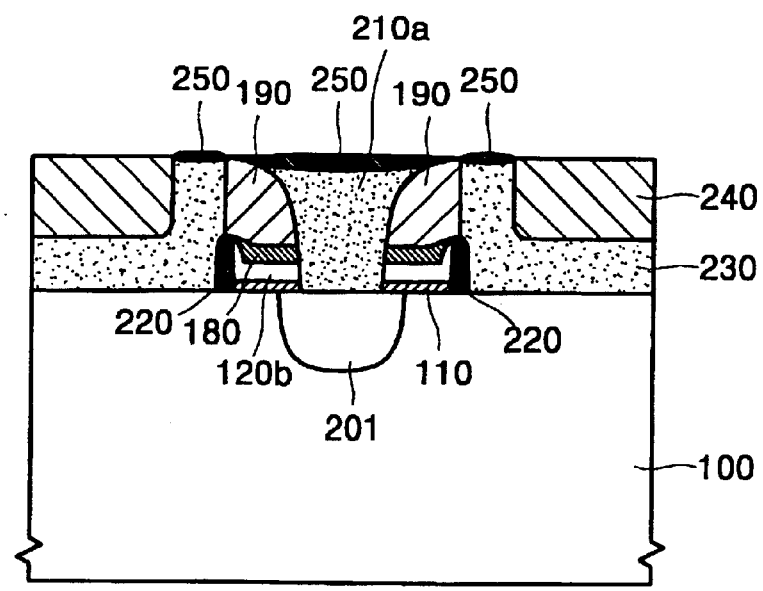

Referring to FIG. 11, the silicon nitride film 240 and the second gate conductive film 230 are sequentially removed by chemical mechanical polishing until the upper portion of the silicon oxide film spacers 190 is exposed. Here, the second gate conductive film 230 on the sidewalls of the silicon oxide film spacers 190 and the polysilicon of the source junction contact fill 210a are exposed. Then, the exposed polysilicon of the second gate conductive film 230 and the source junction contact fill 210a are oxidized, and thus an oxide film 250 is formed on the surface of the polysilicon. In this manner, the region where the silicon nitride film 240 is formed and the region where the silicon oxide film 250 is formed can be divided if viewed from the top of FIG. 11.

Figure 12:
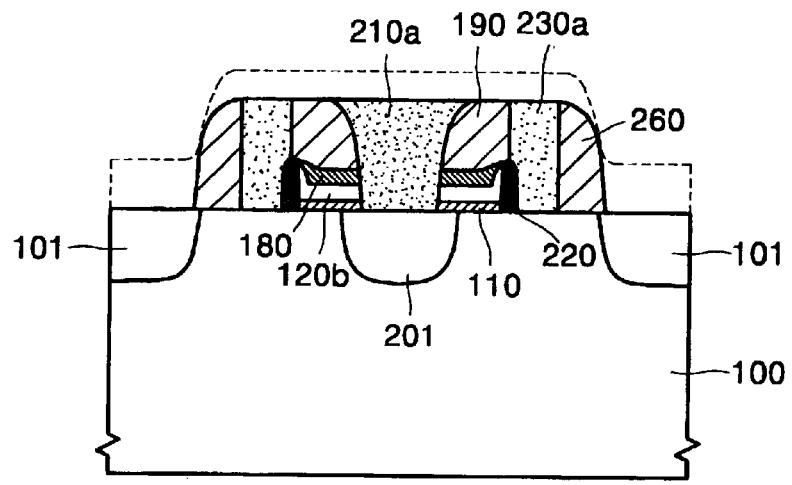
Figure 13:
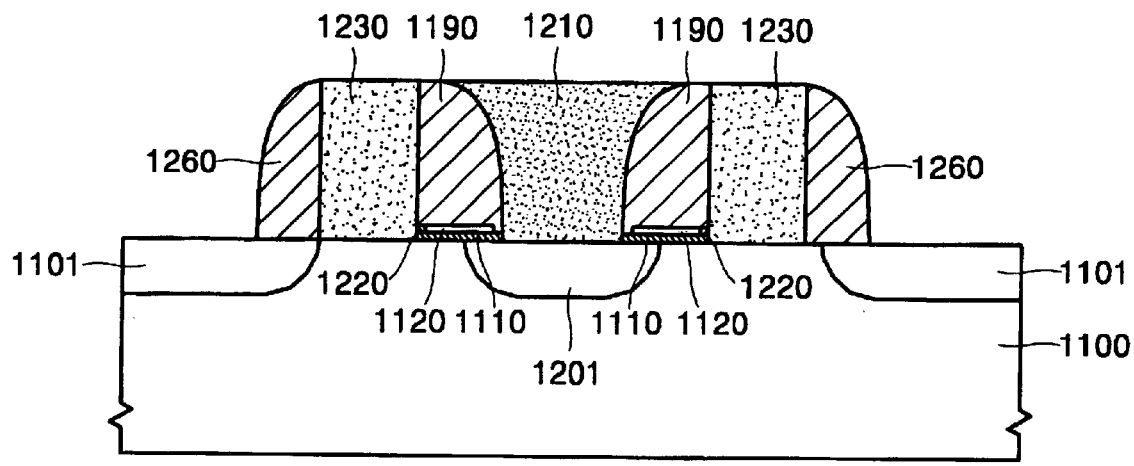
FIG. 13 is a sectional view of a flash memory device manufactured according to a conventional method.

Referring to FIG. 12, the silicon nitride film 240 is fully removed by wet etching using the silicon oxide film 250 as a mask and a phosphoric acid ($H_3PO_4$) solution, and only the second gate conductive film 230 remains. Then, the resultant is etched by dry etching using the silicon oxide film 250 as a mask, and a second gate 230a, i.e., a floating gate of a cell region, is formed along with the first gate 120b.

After that, insulating film spacers 260 are formed of silicon oxide on the sidewalls of the second gate 230a, and a drain junction 101 is formed outwardly from the second gate 230a by ion implantation according to the conventional processes for fabricating the flash memory device.

As described above, a method for manufacturing a flash memory device according to the present invention includes forming and oxidizing the polysilicon spacers 170 when the first gate 120b used as a floating gate is formed (see FIGS. 6 and 7), thereby forming the sharp region in which the first gate 120b contacts the second gate insulating film 220 of the second gate 230a. By doing this, a potential yield can readily occur along the sharp region, and thus the device can operate efficiently and smoothly when data is being erased, owing to improvements in the electric characteristics of the device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a flash memory device, comprising:

(a) sequentially forming a first gate insulating film, a first gate conductive film, and a second insulating film on a semiconductor substrate;

(b) defining a region for a first gate by partially etching the second insulating film to expose an upper portion of the first gate conductive film;
(c) forming second conductive film spacers along sidewalls of the etched second insulating film;
(d) forming an oxide film on the exposed surface of the second conductive film spacers and the first gate conductive film;
(e) forming silicon insulating film spacers on sidewalls of the etched second insulating film;
(f) forming a source junction contact hole by etching the first gate conductive film and the first gate insulating film, using the second insulating film and the silicon insulating film spacers as a mask;
(g) forming a source junction contact fill by filling the source junction contact hole with a conductive film;
(h) forming the first gate by sequentially removing the second insulating film and the first gate conductive film beneath the second insulating film;
(i) forming a second gate insulating film on an exposed sidewall of the first gate;
(j) sequentially forming a second gate conductive film and a silicon nitride film on the semiconductor substrate and exposing upper portions of the source junction contact fill and the second gate conductive film by removing the silicon nitride film so that it is level with an upper portion of the silicon insulating film spacers;
(k) forming a mask silicon oxide film over the exposed source junction contact fill and the second gate conductive film; and
(l) forming a second gate by sequentially removing the exposed silicon nitride film and the second gate conductive film under the silicon nitride film.

2. The method of claim 1, wherein in step (a), the first gate conductive film is formed of conductive polysilicon, and the second insulating film is formed of silicon nitride.

3. The method of claim 1, wherein step (c) further comprises:
  forming conductive polysilicon on the semiconductor substrate; and
  etching the conductive polysilicon by anisotropic dry etching.

4. The method of claim 1, wherein in step (d), the oxide film is a silicon oxide film which is formed by oxidizing the exposed first gate conductive film and the second conductive film spacers.

5. The method of claim 1, wherein step (e) further comprises:
  forming a silicon insulating film on the entire semiconductor substrate; and
  anisotropically etching the silicon insulating film by dry etching.

6. The method of claim 5, wherein the silicon insulating film is a silicon oxide film which is formed by chemical vapor deposition.

7. The method of claim 1, wherein step (g) further comprises:
  forming a filling conductive film on the entire semiconductor substrate; and
  removing the filling conductive film so that it is level with the upper portion of the silicon insulating spacers.

8. The method of claim 7, wherein the filling conductive film is formed of conductive polysilicon.

9. The method of claim 1, wherein step (h) further comprises:
  removing the second insulating film by wet etching by using an etchant solution until the upper portion of the first gate conductive film is exposed; and
  removing the first gate conductive film beneath the second insulating film by dry etching, using the silicon insulating spacers as a mask.

10. The method of claim 9, wherein the etchant solution is a phosphoric acid ($H_3PO_4$) solution.

11. The method of claim 1, wherein in step (i), the second gate insulating film is a silicon oxide film which is formed by thermally oxidizing the first gate conductive film.

12. The method of claim 1, wherein in step (j), the second gate conductive film is formed of conductive polysilicon.

13. The method of claim 1, wherein in step (j), the silicon nitride film is formed by chemical vapor deposition.

14. The method of claim 1, wherein in step (j), the second gate conductive film and the silicon nitride film are removed by chemical mechanical polishing.

15. The method of claim 1, wherein the second gate conductive film is formed of conductive polysilicon.

16. The method of claim 15, wherein the second gate conductive film is formed of a combination of doped polysilicon and undoped polysilicon.

* * * * *